(12) United States Patent
Tanino et al.

(10) Patent No.: US 6,524,385 B1
(45) Date of Patent: Feb. 25, 2003

(54) SINGLE CRYSTAL SIC COMPOSITE MATERIAL FOR PRODUCING A SEMICONDUCTOR DEVICE, AND A METHOD OF PRODUCING THE SAME

(75) Inventors: Kichiya Tanino, Sanda (JP); Nobuhiro Munetomo, Sanda (JP)

(73) Assignee: Nippon Pillar Packing Co., Ltd., Osaka (JP)

(*) Notice: Subject to any disclaimer, the term of this patent is extended or adjusted under 35 U.S.C. 154(b) by 180 days.

(21) Appl. No.: 09/634,599

(22) Filed: Aug. 8, 2000

(30) Foreign Application Priority Data

Aug. 24, 1999 (JP) ............................................ 11-236968

(51) Int. Cl.[7] ........................ C01B 33/021; C30B 1/02; C30B 29/36
(52) U.S. Cl. .................... 117/3; 117/4; 117/88; 423/345
(58) Field of Search ................................ 428/420, 446, 428/698, 700; 117/3, 4, 88; 423/345

(56) References Cited

U.S. PATENT DOCUMENTS

| | | | | |
|---|---|---|---|---|
| 6,053,973 A | * | 4/2000 | Tanino et al. | |
| 6,143,267 A | * | 11/2000 | Tanino | |
| 6,153,165 A | * | 11/2000 | Tanino | |
| 6,153,166 A | * | 11/2000 | Tanino | |
| 6,187,279 B1 | * | 2/2001 | Tanino et al. | |
| 6,203,772 B1 | * | 3/2001 | Tanino et al. | |
| 6,214,107 B1 | * | 4/2001 | Kitabatake | |

* cited by examiner

Primary Examiner—John J. Zimmerman
Assistant Examiner—Jason L Savage
(74) Attorney, Agent, or Firm—Jones, Tullar & Cooper, P.C.

(57) ABSTRACT

In a single crystal SiC composite material for producing a semiconductor device, and a method of producing the same according to the invention, a single crystal SiC film which is produced on an Si substrate by the heteroepitaxial growth method and obtained by removing the Si substrate, is stacked and bonded via a film-like $SiO_2$ layer onto the surface of a polycrystalline plate consisting of Si and C atoms in a closely contacted manner forming thereby a stacked composite member. The stacked composite member is then heat-treated, whereby single crystal SiC in which the crystal is transformed in the same orientation as the single crystal of the single crystal SiC film is integrally grown on the polycrystalline plate. The thickness and the strength which are requested for producing a semiconductor device can be ensured, and lattice defects and micropipe defects seldom occur, so that an accurate and high-quality semiconductor device can be produced.

8 Claims, 4 Drawing Sheets

F I G. 3
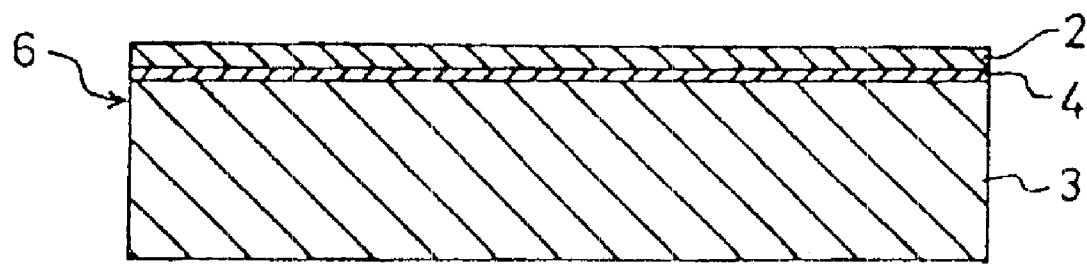

SINGLE CRYSTAL SIC COMPOSITE MATERIAL FOR PRODUCING A SEMICONDUCTOR DEVICE, AND A METHOD OF PRODUCING THE SAME

BACKGROUND OF THE INVENTION

1. Field of the Invention

The present invention relates to a single crystal SiC composite material for producing a semiconductor device, and a method of producing the same, and more particularly to a single crystal SiC composite material for producing, for example, a high-temperature or high-frequency device, or a radiation resistant device such as a light-emitting diode, an X-ray optical element, a switching element, an amplifying element, or an optical sensor, and also to a method of producing such a single crystal SiC composite material.

2. Description of the Prior Art

SiC (silicon carbide) is superior in heat resistance and mechanical strength, and has good resistance to radiation. In addition, it is easy to perform the valence control of electrons and holes by doping an impurity. Moreover, SiC has a wide band gap (for example, single crystal 6H-SiC has a band gap of about 3.0 eV, and single crystal 4H-SiC has a band gap of 3.26 eV). Therefore, it is possible to realize a high-temperature property, a high-frequency property, a dielectric property, and a radiation resisting property which cannot be realized by existing semiconductor materials such as Si (silicone) and GaAs (gallium arsenide). SiC is expected to be the material for the next-generation of semiconductor devices, and studies for a practical use of SiC are being vigorously conducted.

As means for effectively using such excellent properties of SiC as a material for producing a semiconductor device, conventionally, known is a method in which single crystal cubic SiC (β-SiC) is epitaxially grown on a single crystal silicon substrate by the chemical vapor deposition method (heteroepitaxial growth method), thereby obtaining a single crystal SiC material for producing a semiconductor device.

With respect to a single crystal SiC material which is produced by using single crystal silicon as a substrate and epitaxially growing single crystal SiC on the surface of the substrate by the heteroepitaxial growth method as described above, a single crystal SiC material having a larger area can be easily obtained in a large amount and in an economical manner as compared with a material which is produced by another conventional production method such as the sublimation recrystallization method or the improved sublimation recrystallization method. Therefore, the production method is rational and economical. On the other hand, single crystal silicon which is used as a substrate for such a single crystal SiC material has a melting point as low as 1,400° C. Therefore, the substrate is unstable. In a process of mounting a semiconductor device which is performed at a high temperature of 1,500° C. or higher, such as high temperature annealing in the case of doping of P- or N-type impurities, for example, a silicon substrate vanishes, or, even when a silicon substrate does not vanish, the thickness is extremely reduced. Consequently, it is difficult to ensure the thickness and the strength which are requested in the use and handling of a material for producing a semiconductor device. As a result, there arises a disadvantage that warpage or deformation easily occurs in a semiconductor device which is produced from a single crystal SiC material.

Most of single crystal SiC films grown on silicon substrates by the heteroepitaxial growth method are thin or have a thickness of several μm or smaller. The thickness of such a single crystal SiC film is insufficient for allowing the film to be used as it is in a production of a semiconductor device. In order to use such a thin single crystal SiC film in a production of a semiconductor device, therefore, the single crystal SiC film grown on a silicon substrate must be cut off from the silicon substrate, and the thin single crystal SiC film which has been cut off must be transferred onto another substrate which is stable in thickness and strength, and then produced into a predetermined semiconductor device. However, the cutting off of a thin single crystal SiC film of a thickness of several μm at the maximum from a silicon substrate, and the transfer of the thin single crystal SiC film which has been cut off to another substrate cause increase of the number of production steps, and are actually impossible to be implemented.

SUMMARY OF THE INVENTION

The invention has been conducted in view of the above-mentioned circumstances. It is an object of the invention to provide a single crystal SiC composite material for producing a semiconductor device, in which the thickness and the strength required in production of a semiconductor device can be ensured, and lattice defects and micropipe defects due to impurity doping seldom occur to enable a high-quality and accurate semiconductor device to be produced, and a method of producing a single crystal SiC composite material for producing a semiconductor device, which can produces such a material at a very high efficiency.

In order to attain the object, in a single crystal SiC composite material for a semiconductor device of a first aspect of the invention, a single crystal SiC film is stacked and bonded via a film-like $SiO_2$ layer onto a surface of a polycrystalline plate consisting of Si and C atoms in a closely contacted manner, and single crystal SiC is grown on the polycrystalline plate by a heat treatment conducted on the composite member.

In a method of producing a single crystal SiC composite material for a semiconductor device for a second aspect of the invention, a single crystal SiC film is stacked and bonded via a film-like $SiO_2$ layer onto a surface of a polycrystalline plate consisting of Si and C atoms in a closely contacted manner, and the composite member is then heat-treated, whereby single crystal SiC in which the crystal is transformed in the same orientation as the single crystal of the single crystal SiC film is integrally grown on the polycrystalline plate.

According to the first and second aspects of the invention, having the above-mentioned characteristic configuration, the polycrystalline plate consisting of Si and C atoms and having heat resistance similar to that of single crystal SiC, and the thin single crystal SiC film are stacked and bonded together in a closely contacted manner while interposing the $SiO_2$ layer having a low thermal conductivity between the plate and the film, and the composite member is then heat-treated. Therefore, the polycrystalline plate serving as a device substrate is prevented from vanishing or thinning in a thermal treating process, and also in a production process of a semiconductor device conducted at a high temperature, such as high temperature annealing, whereby the thickness and the strength which are requested for a material for producing a semiconductor device can be stably ensured. Consequently, an accurate and high-quality semiconductor device which is free from warpage and deformation can be produced.

While impurities are prevented by the intermediate $SiO_2$ layer from entering from the atmosphere into the bonding interface during the heat treatment, the intermediate $SiO_2$ layer is thermally decomposed into Si and $O_2$ as the heat treatment advances. The thermally decomposed $O_2$ escapes to the outside with floatingly diffusing in the intermediate layer region. On the other hand, single crystal SiC can be integrally grown on the polycrystalline plate by the solid phase growth in which the thermally decomposed Si atoms, and Si and C atoms that sublime from the surface of the polycrystalline plate are rapidly diffused and moved toward the single crystal SiC film which is maintained at a lower temperature, to be rearranged in accordance with the single crystal orientation of the single crystal SiC film. According to this configuration, it is possible to attain effects that a single crystal SiC composite material for producing a semiconductor device which is thick and has a high quality can be efficiently produced, and that the quality of a semiconductor device which is produced by using the material can be improved.

In the single crystal SiC composite material for a semiconductor device of the first aspect of the invention, and the method of producing a single crystal SiC composite material for a semiconductor device of the second aspect of the invention, a member which is produced by stacking a single crystal SiC film that is produced on an Si substrate by a heteroepitaxial growth method, via the $SiO_2$ layer onto the surface of the polycrystalline late in a closely contacted manner, bonding the single crystal SiC film to the polycrystalline plate by a heat treatment on the composite material, and removing away the Si substrate under the bonded state by at least one of hydrofluoric acid and nitric acid is used as the composite member. According to this configuration, a single crystal SiC film itself which is requested to have a large area in order to obtain a composite material that is applicable to the production of semiconductor devices of various sizes can be easily produced in a large amount and in an economical manner. Therefore, a single crystal SiC composite material for producing a semiconductor device which is a final product can be increased in size and reduced in production cost.

It is most preferable to use an SiC polycrystalline plate which is produced into a plate-like shape by a thermal chemical vapor deposition method (hereinafter referred to as a thermal CVD method) wherein mixture of impurities in the production process is performed at the minimum level, as the polycrystalline plate which is used in the single crystal SiC composite material for a semiconductor device of the first invention, and the method of producing a single crystal SiC composite material for a semiconductor device of the second invention. Alternatively, an SiC sintered member having heat resistance similar to that of single crystal SiC may be used so that vanishing and thinning do not occur in a thermal treating process (in a temperature range of 1,850 to 2,000° C.) on the composite material, and also in a production process of a semiconductor device.

As the $SiO_2$ layer used in the method of producing a single crystal SiC composite material for a semiconductor device of the second invention, a member may be employed which is formed into a film-like shape by one of application of $SiO_2$ powder or a silicon compound containing silicon oil, silicon resin, or silicon grease, and thermal oxidation of the single crystal SiC film and/or the surface of the polycrystalline plate. Among these means, means for applying powder or the like which requires a smaller number of production steps and can be performed by simple works is most preferably used.

Other objects and effects of the invention will be clarified in an embodiment which will be described below.

BRIEF DESCRIPTION OF THE DRAWINGS

FIG. 3 is a schematic section view of a composite member which is obtained as a result of the third and fourth steps of the production steps.

PREFERRED EMBODIMENTS OF THE INVENTION

Hereinafter, an embodiment of the invention will be described with reference to the drawings.

Figure 1:
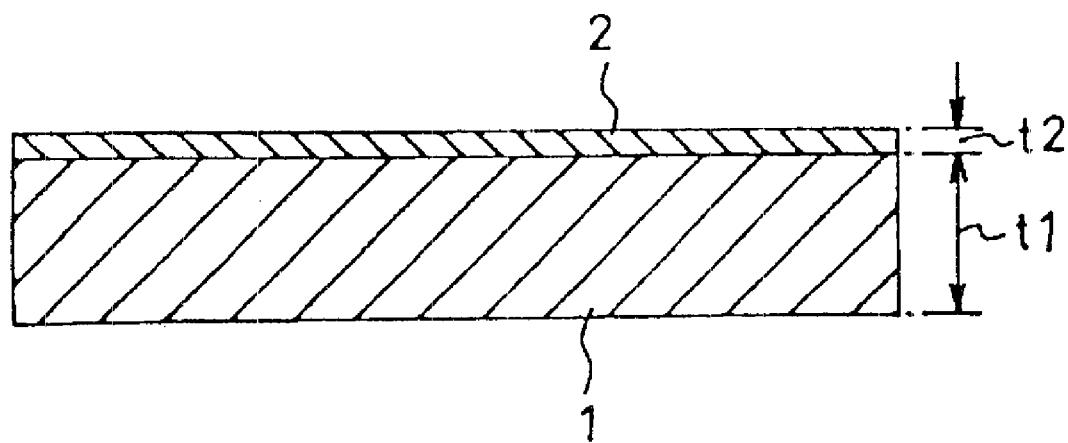
FIG. 1 is a schematic section view illustrating the results of a first step of production steps of a single crystal SiC composite material for producing a semiconductor device according to the invention.

FIGS. 1 to 4 are views illustrating the results of steps of the method of producing such a single crystal SiC composite material for producing a semiconductor device of the invention. In a first step, the results of which are shown in FIG. 1, a single crystal SiC film 2 in which the thickness t2 is about 1 μm is formed by the heteroepitaxial growth method on a single crystal Si substrate 1 in which the thickness t1 is about 0.5 cm.

Figure 2:
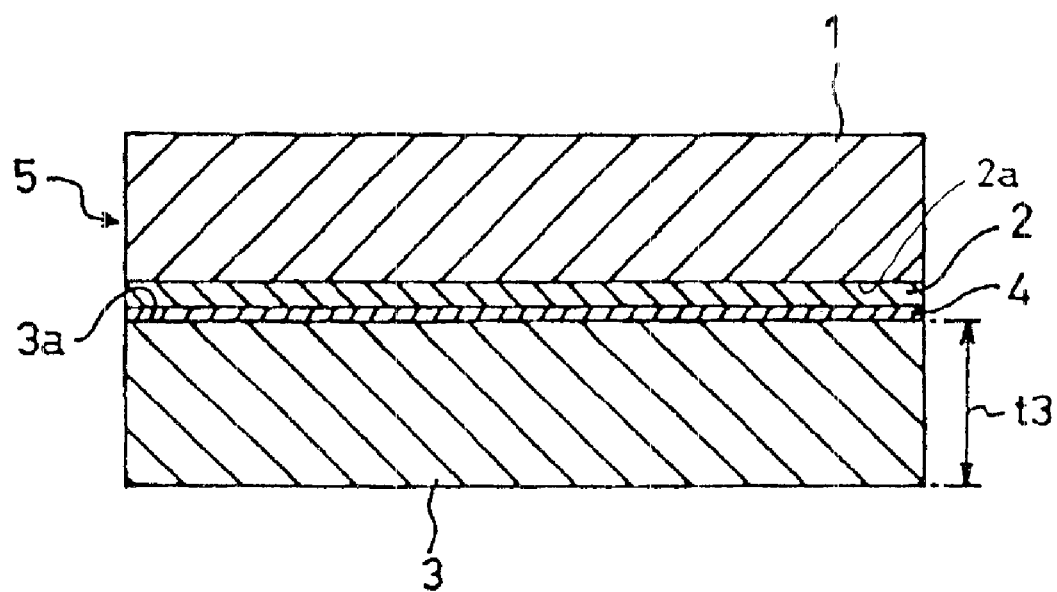
FIG. 2 is a schematic section view illustrating the results of a second step of the production steps.

In a second step, the results of which are shown in FIG. 2, the single crystal SiC film 2 which is formed on the Si substrate 1 is then stacked via a film-like $SiO_2$ layer 4 in a closely contacted manner onto a mirror-polished surface 3a of a polycrystalline plate 3 which is formed by the thermal CVD method into a flat plate-like shape having a thickness t3 of about 0.7 cm. As the $SiO_2$ layer 4, any one of a member which is formed by applying $SiO_2$ powder or a silicon compound containing silicon oil, silicon resin, silicon grease, or the like at a thickness of 1,000 angstroms or more, and that which is formed into a film-like shape by thermally oxidizing the mirror-polished surface 3a of the polycrystalline plate 3 may be used.

In a third step, next, the stacked member 5 having the structure shown in FIG. 2 is inserted and placed in, for example, a resistance oven (not shown), and then heated to and maintained at a temperature of 1,100 to 1,500° C. for a fixed time period, thereby bonding the polycrystalline plate 3 and the single crystal SiC film 2 together. As a result of this heat treatment for bonding, a part of the single crystal Si substrate 1 has already vanished.

In a fourth step, thereafter, the residual Si substrate 1 in the stacked member 5 is dissolved by using a mixed acid of hydrofluoric acid (HF) and nitric acid ($HNO_3$) to be completely removed away, to obtain a composite member 6 in which, as shown in FIG. 3, only the single crystal SiC film 2 is bonded onto the surface 3a of the polycrystalline plate 3 via the $SiO_2$ layer 4.

Figure 4:
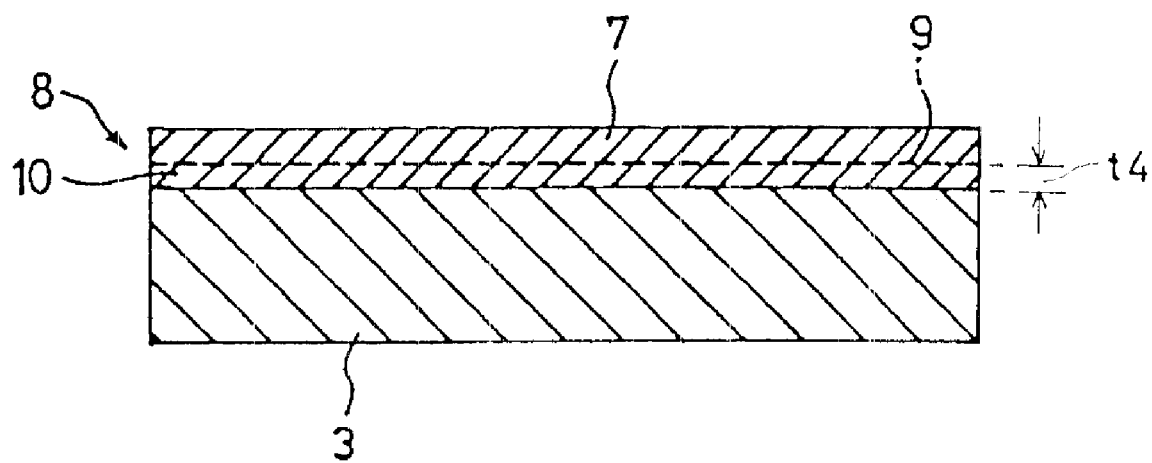
FIG. 4 is a schematic section view of a single crystal SiC composite material for producing a semiconductor device which is obtained as a result of a fifth step of the production steps.

The thus obtained composite member 6 is placed in the resistance oven, an inert gas such as Ar is injected into the oven, and the average oven temperature is raised to about 1,850 to 2,000° C. and then maintained for about one to two hours. In this way, a thermal treatment (a fifth step) is performed in an inert gas atmosphere and under a saturated SiC vapor pressure. As a result, as shown in FIG. 4, the $SiO_2$ layer 4 is thermally decomposed to diffuse and vanish, and a single crystal SiC composite material 8 for producing a semiconductor device is produced in which single crystal SiC 7 wherein the crystal is transformed in the same orientation as the single crystal of the single crystal SiC film 2 is integrally grown on the polycrystalline plate 3.

The base material of the composite member 6 which has the structure shown in FIG. 3, and which is used in the heat treating step (fifth step) of the above-described production steps is the polycrystalline plate 3 which originally has high heat resistance (melting point). Therefore, there is no fear that the polycrystalline plate 3 serving as a device substrate vanishes or thins not only in the heat treating process in a temperature range of 1,850 to 2,000° C. but also in a process of producing a semiconductor device by using the single crystal SiC composite material 8 that is produced as a result of the fifth step, for example, a process of producing a semiconductor device which is performed at a high temperature of 1,500° C. or higher, such as high temperature annealing in the case of doping of P- or N-type impurities. Therefore, it is possible to obtain the single crystal SiC composite material 8 for producing a semiconductor device in which the thickness and the strength that are requested for a material for producing a semiconductor device can be stably ensured.

In spite of the above, the surface 3a of the polycrystalline plate 3, and the surface 2a of the single crystal SiC film 2 which constitute the composite member 6 having the structure shown in FIG. 3 are closely contacted to each other via the $SiO_2$ layer 4 without forming a gap. While impurities are prevented from entering from the atmosphere into the bonding interface 9 between the polycrystalline plate 3 and the single crystal SiC film 2 during the heat treatment, therefore, the intermediate $SiO_2$ layer 4 is thermally decomposed into Si and $O_2$ as the heat treatment advances. The thermally decomposed $O_2$ escapes to the outside with floatingly diffusing in the intermediate layer region. On the other hand, the solid phase growth is performed in which the thermally decomposed Si atoms, and Si and C atoms that sublime from the surface of the polycrystalline plate 3 are rapidly diffused and moved toward the single crystal SiC film 2 which is maintained at a lower temperature, and the portion extending from the bonding interface 9 of the polycrystalline plate 3 by a thickness t4 of about 200 $\mu$m is rearranged in accordance with the single crystal orientation of the single crystal SiC film 2. As a result, the single crystal SiC composite material 8 in which a thick single crystal SiC portion 10 of a high quality is integrally grown on the polycrystalline plate 3 can be obtained.

In the embodiment, a member which is formed by the thermal CVD method into a flat plate-like shape is used as the polycrystalline plate 3 configured by Si and C atoms. Alternatively, a member having heat resistance similar to that of single crystal SiC, such as an SiC sintered member of high purity, an amorphous SiC, or a polycrystalline α-SiC plate may be used so that vanishing and thinning do not occur in a thermal treating process (in a temperature range of 1,850 to 2,000° C.), and also in a production process of a semiconductor device, whereby a single crystal SiC composite material for producing a semiconductor device in which the thickness and the strength that are requested for a material for producing a semiconductor device are stably ensured can be obtained.

The entire disclosure of Japanese Patent Application No. 11-236968 filed on Aug. 24, 1999 including specification, claims, drawings, and summary are incorporated herein by reference in its entirety.

What is claimed is:

1. A method of producing a single crystal SiC composite material for producing a semiconductor device, comprising the steps of:

bonding a single crystal SiC film via a $SiO_2$ film layer onto a surface of a polycrystalline plate consisting of Si and C atoms in a closely contacted manner, forming thereby a composite member; and heat-treating the composite member, thereby growing single crystal SiC in which crystal is transformed in the same orientation as single crystal of the single crystal SiC film, integrally on the polycrystalline plate.

2. A method of producing a single crystal SiC composite material for producing a semiconductor device according to claim 1, wherein the single crystal SiC film is produced on an Si substrate by a heteroepitaxial growth method, and stacked via the $SiO_2$ film layer onto the surface of the polycrystalline plate in a closely contacted manner, and wherein the single crystal SiC film is bonded to the polycrystalline plate by a heat treatment on the stacked composite material at a temperature of 1,100 to 1,500° C., and, after the bonding, removing away the Si substrate by at least one of hydrofluoric acid and nitric acid.

3. A method of producing a single crystal SiC composite material for producing a semiconductor device according to claim 2, wherein the polycrystalline plate is an SiC polycrystalline plate which is produced into a plate shape by one of a thermal chemical vapor deposition method and an SiC sintered member.

4. A method of producing a single crystal SiC composite material for producing a semiconductor device according to claim 2, wherein the $SiO_2$ film layer is formed into a film shape by application of one of $SiO_2$ powder, a silicon compound, thermal oxidation of the single crystal SiC film, and/or the surface of the polycrystalline plate.

5. A method of producing a single crystal SiC composite material for producing a semiconductor device according to claim 2, wherein a temperature of said heat treatment on the composite member is set to a range of 1,850 to 2,000° C.

6. A method of producing a single crystal SiC composite material for producing a semiconductor device according to claim 1, wherein the polycrystalline plate is an SiC polycrystalline plate which is produced into a plate shape by one of a thermal chemical vapor deposition method and an SiC sintered member.

7. A method of producing a single crystal SiC composite material for producing a semiconductor device according to claim 1, wherein the $SiO_2$ film layer is formed into a film shape by application of one of $SiO_2$ powder, a silicon compound, and thermal oxidation of the single crystal SiC film and/or the surface of the polycrystalline plate.

8. A method of producing a single crystal SiC composite material for producing a semiconductor device according to claim 1, wherein a temperature of said heat treatment on the composite member is set to a range of 1,850 to 2,000° C.

* * * * *

UNITED STATES PATENT AND TRADEMARK OFFICE
CERTIFICATE OF CORRECTION

PATENT NO. : 6,524,385 B1
DATED : February 25, 2003
INVENTOR(S) : Kichiya Tanino and Nobuhiro Munetomo It is certified that error appears in the above-identified patent and that said Letters Patent is hereby corrected as shown below:

<u>Title page,</u>
Item [73], Assignee: "Nippon Pillar Packing Co., Ltd., Osaka (JP)" should be
-- Nissin Electric Co., Ltd., Kyoto (JP) --
Item [74], *Attorney, Agent or Firm*, "Jones, Tullar & Cooper, P.C." should be -- Bacon & Thomas, PLLC --

Signed and Sealed this

Sixth Day of April, 2004

JON W. DUDAS
*Acting Director of the United States Patent and Trademark Office*